(12) United States Patent
Jäger et al.

(10) Patent No.: US 9,763,337 B2
(45) Date of Patent: Sep. 12, 2017

(54) SEMI-FINISHED PRODUCT FOR THE PRODUCTION OF A PRINTED CIRCUIT BOARD, METHOD FOR PRODUCING A PRINTED CIRCUIT BOARD AND PRINTED CIRCUIT BOARD

(71) Applicant: AT&S Austria Technologie & Systemtechnik Aktiengesellschaft, Leoben (AT)

(72) Inventors: Stefan Jäger, Vienna (AT); Markus Leitgeb, Trofaiach (AT); Thomas Judge, Leoben (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 14/652,416

(22) PCT Filed: Dec. 20, 2013

(86) PCT No.: PCT/AT2013/050262
§ 371 (c)(1),
(2) Date: Jun. 15, 2015

(87) PCT Pub. No.: WO2014/094028
PCT Pub. Date: Jun. 26, 2014

(65) Prior Publication Data
US 2015/0342062 A1    Nov. 26, 2015

(30) Foreign Application Priority Data
Dec. 20, 2012  (CN) .......................... 2012 1 0560019

(51) Int. Cl.
*H05K 1/03* (2006.01)
*H05K 3/38* (2006.01)
(Continued)

(52) U.S. Cl.
CPC .......... *H05K 3/387* (2013.01); *H05K 1/0298* (2013.01); *H05K 1/034* (2013.01); *H05K 1/0346* (2013.01);
(Continued)

(58) Field of Classification Search
CPC ...... H05K 3/387; H05K 1/111; H05K 3/4632; H05K 1/09; H05K 1/0298; H05K 1/034;
(Continued)

(56) References Cited

U.S. PATENT DOCUMENTS 6,120,693 A * 9/2000 Petti ..................... H05K 3/0023
216/18
2002/0036100 A1 * 3/2002 Slemmons .......... H01L 21/4853
174/255

(Continued)

OTHER PUBLICATIONS

International Preliminary Report on Patentability for International Application No. PCT/AT2013/050262, Report issued Mar. 11, 2015, Mailed Mar. 11, 2015, 14 Pgs.

(Continued)

*Primary Examiner* — Steven T Sawyer
(74) *Attorney, Agent, or Firm* — KPPB LLP

(57) ABSTRACT

A semi-finished product for the production of a printed circuit board having a plurality of alternately arranged insulating layers and conductive layers and at least one hard gold-plated edge connector is characterized by the hard gold-plated edge connector being arranged on an inner conductive layer of the semi-finished product and being fully covered by at least one group of an insulating layer and a conductive layer. The inventive Method for producing a printed circuit board having a plurality of alternately arranged insulating layers and conductive layers and at least one hard gold-plated edge connector, where an outer conductive layer is surface treated, is characterized by the steps of providing a hard gold-plated edge connector on a group (Continued)

Figure 1:
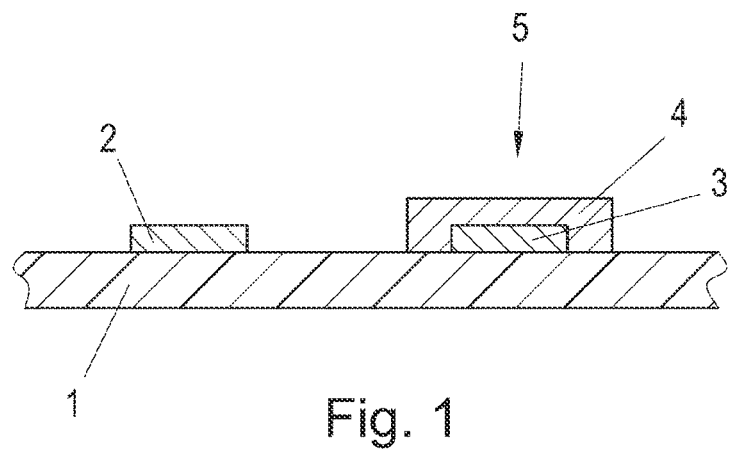

of an insulating layer and a conductive layer, covering the conductive layer and the hard gold-plated edge connector with at least one group of an insulating layer and a conductive layer, surface-treating an outer conductive layer to form connector pads for wire bonding of electronic components, cutting the insulating layers and the conductive layers down to the conductive layer forming the hard gold-plated edge connector, removing the insulating layers and conductive layers from the hard gold-plated edge connector. The inventive printed circuit board comprised of a plurality of alternately arranged insulating layers and conductive layers and at least one hard gold-plated edge connector is characterized by the hard gold-plated edge connector being arranged on an inner conductive layer of the printed circuit board, and the inner conductive layer forming the hard gold-plated edge connector protruding from the plurality of insulating layers and conductive layers.

3 Claims, 2 Drawing Sheets

(51) Int. Cl.

| | | |
|---|---|---|
| *H05K 1/11* | (2006.01) | |
| *H05K 1/02* | (2006.01) | |
| *H05K 3/46* | (2006.01) | |
| *H05K 1/09* | (2006.01) | |
| *H05K 3/24* | (2006.01) | |

(52) U.S. Cl.
CPC ............... *H05K 1/09* (2013.01); *H05K 1/111* (2013.01); *H05K 1/117* (2013.01); *H05K 3/244* (2013.01); *H05K 3/4632* (2013.01); *H05K 3/4611* (2013.01); *H05K 2201/015* (2013.01); *H05K 2201/0154* (2013.01); *H05K 2201/0919* (2013.01); *H05K 2201/09127* (2013.01); *H05K 2201/09845* (2013.01); *H05K 2203/0228* (2013.01); *H05K 2203/068* (2013.01)

(58) Field of Classification Search
CPC ...... H05K 1/0346; H05K 3/244; H05K 1/117; H05K 2201/09918
USPC ........................................................ 429/96.1
See application file for complete search history.

(56) References Cited

U.S. PATENT DOCUMENTS

| | | | |
|---|---|---|---|
| 2005/0190537 A1 | 9/2005 | Rossi et al. | |
| 2006/0008970 A1 | 1/2006 | Oggioni et al. | |
| 2006/0101638 A1 | 5/2006 | Germann et al. | |
| 2011/0183093 A1* | 7/2011 | Wada | C09J 7/0217 |
| | | | 428/35.7 |
| 2011/0272177 A1 | 11/2011 | Weichslberger et al. | |
| 2011/0304998 A1* | 12/2011 | Lin | H01L 23/49838 |
| | | | 361/783 |

OTHER PUBLICATIONS

International Search Report and Written Opinion for International Application No. PCT/AT2013/050262, Search completed Mar. 18, 2014, Mailed Mar. 27, 2014, 3 Pgs.

* cited by examiner

SEMI-FINISHED PRODUCT FOR THE PRODUCTION OF A PRINTED CIRCUIT BOARD, METHOD FOR PRODUCING A PRINTED CIRCUIT BOARD AND PRINTED CIRCUIT BOARD

CROSS REFERENCE TO RELATED APPLICATIONS

This application is a national phase 35 U.S.C. §371 filing of PCT Application No. PCT/AT2013/050262 filed on Dec. 20, 2013 which claims priority to Chinese Application No. 201210560019.2 filed on Dec. 20, 2012, the disclosures of which are hereby incorporated by reference in their entireties.

BACKGROUND OF THE INVENTION

Field of the Invention

The invention relates to a semi-finished product for the production of a printed circuit board having a plurality of alternately arranged insulating layers and conductive layers and at least one hard gold-plated edge connector, a method for producing a printed circuit board as well as a printed circuit board.

Description of the Related Art

Printed circuit boards, also referred to as printed wire boards are panels carrying and electrically connecting electronic components such as transistors and the like and, hence, form vital parts of electronic products. Printed circuit boards have a more or less complex structure depending on the specific application. In general a printed circuit board has a plurality of alternately arranged conductive layers and insulating layers bonded together by panels of glass fibres impregnated with organic resin, said panels forming the insulating layers. Such panels for use in the production of printed circuit boards are widely known in the industry as "prepregs" (preimpregnated fibres), which are delivered and processed in an uncured, hence viscous state of the organic resin. The actual insulating layers of the printed circuit board result when the organic resin has cured. The insulating layers carry conductive layers, usually formed of copper foil, the conductive layers being appropriately structured to form wirings to electrically connect the electronic components. Modern printed circuit boards allow for a high degree of integration of electronic components and their appropriate wiring.

In many applications printed circuit boards are produced as exchangeable boards that can be inserted into appropriate jacks of electronic machines, such as, for example, computers. To this end, printed circuit boards have edge connectors, also known in the art as tabs or fingers. Edge connectors of printed circuit boards have to provide low contact resistance as well as high wear resistance which is why they are often electroplated with precious metals. In this context, gold electroplating is commonly used. Since gold is a rather soft metal that would not provide the necessary wear resistance it is alloyed with nickel, cobalt or indium for the purpose just described. This alloy called hard gold is then electroplated on contacts formed of copper which have been obtained previously by known structuring procedures of conductive layers of a printed circuit board. A typical edge connector would feature a 1 µm-3 µm gold-plating with an undercoat of 4 µm nickel on a copper contact. The edge connector together with the insulating layers and conductive layers supporting the edge connector normally has a thickness corresponding to standard thicknesses of industrially used standard jacks so that it can easily be inserted into the corresponding jacks.

While an above-described gold-plated edge connector provides superior contacting and wear properties for contacting a printed circuit board to a jack of an electronic machine it is often necessary to provide contacting substrates having completely different properties for contacting electronic components on the printing circuit board, such as resistors, capacitors, inductors, diodes, transistors, thyristors, integrated circuits and the like. Often these components are contacted to the printed circuit board by wire bonding, a process in which the pins of an electronic component are connected to the pads of the printed circuit boards by means of bond wires. A preferred surface treatment to enable wire bonding procedures is known as "ENEPIG". ENEPIG stands for "electroless nickel, electroless palladium, immersion gold" and means applying a layer of nickel and a layer of palladium on a pad contact of a printed circuit board to be contacted by wire bonding by an electroless, hence reductive method. Finally, the pad of the printed circuit board covered with nickel and palladium is covered with a layer of gold applied by immersion plating.

The production of printed circuit boards having hard gold-plated edge connectors and at the same time connector pads for electronic components coated with the ENEPIG technology imposes technological difficulties and hence brings about relatively high costs in the production. This is due to the fact that the areas plated with hard gold have to be protected or masked from the chemical substances used in the ENEPIG surface treatment to avoid deposition of the ENEPIG-layer. In the state of the art, the previously prepared hard gold-plated edge connectors were covered with dry film or photoresist lacquer before the printed circuit board was subjected to the ENEPIG treatment. In doing so it is, however, problematic that the dry film or the photoresist lacquer used to cover and protect the hard gold-plated edge connectors from the chemicals used in the ENEPIG treatment is dissolved to a considerable amount into the baths of the ENEPIG treatment line, so that the chemicals were quickly contaminated with the organics of the film or the lacquer and had to be frequently discarded, thereby dramatically increasing the production costs also due to considerable expenditure for environmentally safe disposal of the spent chemicals.

It is thus an object of the present invention to improve semi-finished products as initially described in order to overcome the above-described dissolution problems.

SUMMARY OF THE INVENTION

To achieve this object, a semi-finished product as initially mentioned is, according to the present invention, characterised in that the hard gold-plated edge connector is arranged on an inner conductive layer of the semi-finished product and is fully covered by at least one group of an insulating layer and a conductive layer.

In the inventive semi-finished product the hard gold-plated edge connector is embedded in the interior of the future printed circuit board and covered by at least one group of an insulating layer and a conductive layer. As described above, the insulating layer usually takes the form of a prepreg and the conductive layer usually is comprised of a copper foil laminated onto the prepreg material of the insulating layer. These two layers effectively separate the hard gold-plated edge connector from chemicals used in subsequent steps of surface treatment, such as in particular the above-described ENEPIG technology. The inventive semi-finished product can easily be produced by well-known laminating techniques already used in creating build-up structures of printed circuit boards. It is readily apparent to the person skilled in the art that the semi-finished product according to the invention may contain more than one hard gold-plated edge connector arranged on the same or on different inner conductive layers of the semi-finished product.

According to a preferred embodiment of the present invention, the hard gold-plated edge connector is coated with a release layer arranged between the hard gold-plated edge connector and the at least one group of the insulating layer and the conductive layer covering the hard gold-plated edge connector. Such release layers are commonly known and prevent the lamination or bonding process of a printed circuit board to effectively occur in the coated area, so that the at least one group of an insulating layer and a conductive layer can easily be removed from the semi-finished product to yield the final printed circuit board. A release layer in the sense of the present invention is fully disclosed in applicants US 2011/0272177 A1, in which it is referred to as a "material preventing adhesion".

Preferably, the release layer is formed by a material selected from the group comprised of of metal soaps of Al, Mg, Ca, Na and Zn, combined with a binding agent and a solvent. With these materials an easy removal of the layers covering the hard gold-plating edge connector or hard gold-plated edge connectors can be achieved. These materials have in common that they can be applied as liquids by methodds well known in the art of production of printed circuit boards such as application by inkjet or screen printing.

On the contrary, but also according to a preferred embodiment of the present invention, the release layer is formed by a thermostable sheet. Such thermostable sheets are available on an industrial scale and can be inserted into the semi-finished product in order to promote the removal of the at least one group of an insulating layer and a conductive layer from the semi-finished product to yield the final printed circuit board.

Preferably, the thermostable sheet is a sheet of tetrafluoroethylene (Teflon®), polyvinylfluoride (Tedlar®) or polyimide.

As described above, the semi-finished product according to the present invention is designed to allow for the production of printed circuit boards having surface areas with different finishes or subjected to surface treatments at low cost and in an environmentally safe way. These benefits are realised in a particularly pronounced way, when according to a preferred embodiment of the present invention, an outer conductive layer is surface-treated to have connector pads for wire bonding of electronic components and the connector pads are made of nickel deposited by electroless plating, palladium deposited by electroless plating and gold deposited by immersion plating. This surface treatment is known as ENEPIG technology and is particularly sensitive to dissolution or leaching of organic dry films or lacquers used to mask the hard gold-plated edge connectors so that the inventive semi-finished product provides considerable improvement by covering the hard gold-plated edge connector or hard gold-plated edge connectors with an insulating layer and a conductive layer which layers are not prone to leaching into the chemicals of the ENEPIG technology.

In order to avoid bending or warping and also for electrical and build-up reasons printed circuit boards are normally produced by symmetrically and laminating insulating layers and conductive layers on both sides of a central core. In the art, the term "core" relates to an insulating layer, normally made from prepreg material, coated on both sides with a layer of copper. Accordingly, the semi-finished product according to the present invention preferably has a symmetrical structure with respect to a central insulating layer.

The inventive method for producing a printed circuit board having a plurality of alternately arranged insulating layers and conductive layers and at least one hard gold-plated edge connector, where an outer conductive layer is surface treated, is characterised by the steps of providing a hard gold-plated edge connector on a group of an insulating layer and a conductive layer, covering the conductive layer and the hard gold-plated edge connector with at least one group of an insulating layer and a conductive layer, surface-treating an outer conductive layer to form connector pads for wire bonding of electronic components, cutting the insulating layers and the conductive layers down to the conductive layer forming the hard gold-plated edge connector, removing the insulating layers and conductive layers from the hard gold-plated edge connector.

In the inventive method, the hard gold-plated edge connector is embedded in the interior of the future printed circuit board and covered by at least one group of an insulating layer and a conductive layer during the step of surface treating an outer conductive layer. As described above, the insulating layer usually takes the form of a prepreg and the conductive layer usually is comprised of a copper foil laminated onto the prepreg material of the insulating layer. These two layers effectively separate the hard gold-plated edge connector from chemicals used in subsequent steps of surface treatment, such as in particular the above-described ENEPIG technology. The inventive method employs well-known laminating techniques already used in creating build-up structures of printed circuit boards. It is readily apparent to the person skilled in the art that the method according to the invention may lead to more than one hard gold-plated edge connector arranged on the same or on different inner conductive layers of the semi-finished product.

Preferably, the inventive method is further developed such that the hard gold-plated edge connector is coated with a release layer before the step of covering the conductive layer and the hard gold-plated edge connector. Such release layers are commonly known and prevent the lamination or bonding process of a printed circuit board to effectively occur in the coated area, so that the at least one group of an insulating layer and a conductive layer can easily be removed from the semi-finished product to yield the final printed circuit board.

According to a preferred embodiment of the inventive method, the release layer is formed by a material selected from the group comprised of metal soaps of Al, Mg, Ca, Na and Zn, combined with a binding agent and a solvent. With these materials an easy removal of the layers covering the hard gold-plating edge connector or hard gold-plated edge connectors can be achieved. These materials have in common that they can be applied as liquids by methodds well known in the art of production of printed circuit boards such as application by inkjet or screen printing.

On the contrary, but also according to a preferred embodiment of the present invention, the release layer is formed by a thermostable sheet. Such thermostable sheets are available on an industrial scale and can be inserted into the semi-finished product in order to promote the removal of the at least one group of an insulating layer and a conductive layer from the semi-finished product to yield the final printed circuit board.

Preferably, the thermostable sheet is a sheet of tetrafluoroethylene (Teflon®), polyvinylfluoride (Tedlar®) or polyimide.

As described above, the method according to the present invention is developed to allow for the production of printed circuit boards having surface areas with different finishes or printed circuit boards subjected to surface treatments at low cost and in an environmentally safe way. These benefits are realised in a particularly pronounced way, when according to a preferred embodiment of the present invention, an outer conductive layer is surface-treated to have connector pads for wire bonding of electronic components and the connector pads are made of nickel deposited by electroless plating, palladium deposited by electroless plating and gold deposited by immersion plating. This surface treatment is known as ENEPIG technology and is particularly sensitive to dissolution or leaching of organic dry films or lacquers used to mask the hard gold-plated edge connectors so that the inventive semi-finished product provides considerable improvement by covering the hard gold-plated edge connector or hard gold-plated edge connectors with an insulating layer and a conductive layer which layers are not prone to leaching into the chemicals of the ENEPIG technology.

In order to avoid bending or warping of a printed circuit board these boards are normally produced by symmetrically laminating insulating layers and conductive layers on both sides of a central core. In the art, the term "core" relates to an insulating layer, normally made from prepreg material, coated on both sides with a layer of copper. Accordingly, the inventive method is preferably carried out such that the conductive layers and the insulating layers are symmetrically applied to form a printed circuit board symmetrical with respect to a central insulating layer.

The inventive printed circuit board comprised of a plurality of alternately arranged insulating layers and conductive layers and at least one hard gold-plated edge connector, is characterised in that the hard gold-plated edge connector is arranged on an inner conductive layer of the printed circuit board, the inner conductive layer forming the hard gold-plated edge connector protruding from the plurality of insulating layers and conductive layers. This printed circuit board is the result of carrying out the inventive method.

As described above, the printed circuit board according to the present invention is developed to allow for the production of printed circuit boards having surface areas with different finishes or printed circuit boards subjected to surface treatments at low cost and in an environmentally safe way. These benefits are realised in a particularly pronounced way, when according to a preferred embodiment of the present invention, an outer conductive layer of the printed circuit board is surface-treated to have connector pads for wire bonding of electronic components and the connector pads are made of nickel deposited by electroless plating, palladium deposited by electroless plating and gold deposited by immersion plating. This surface treatment is known as ENEPIG technology and is particularly sensitive to dissolution or leaching of organic dry films or lacquers used to mask the hard gold-plated edge connectors so that the inventive semi-finished product provides considerable improvement by covering the hard gold-plated edge connector or hard gold-plated edge connectors with an insulating layer and a conductive layer which layers are not prone to leaching into the chemicals of the ENEPIG technology.

In the context of the present invention, the edge connector together with the insulating layers and conductive layers supporting the edge connector preferably has a thickness corresponding to standard thicknesses of industrially used standard jacks so that it can easily be inserted into the corresponding jacks.

Figure 2:
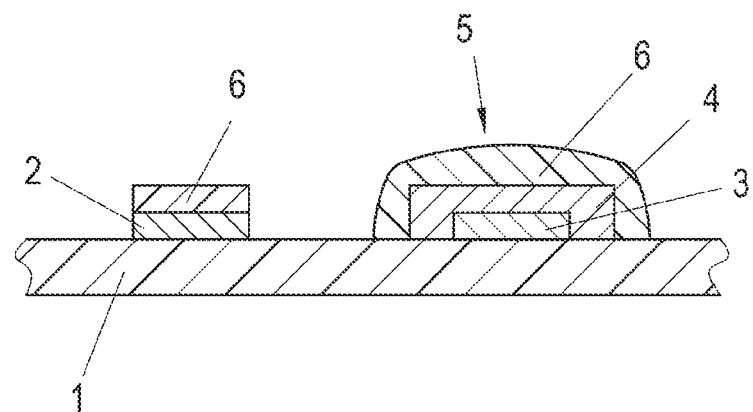

The present invention will now be exemplified in more detail by ways of an exemplary embodiment shown in the drawings in which FIGS. 1 and 2 show production steps known from the state of the art of a printed circuit board having a hard gold-plated edge connector and also having connector pads for electronic components coated with the ENEPIG technology on the same conductive layer and FIG. 3 shows a flow chart of the inventive method and a depiction of the inventive semi-finished product and the inventive printed circuit board.

In FIG. 1 an insulating layer of a printed circuit board is denoted by 1. As it is commonly known in the art of producing printed circuit boards, the insulating layer 1 is covered with a conductive layer that is structured by known imaging techniques to form wirings and pads for contacting electronic components or pads that serve as edge connectors as previously described. In FIG. 1 the conductive layer has been structured to form a first pad 2 to contact an electronic component, such as a resistor, a capacitor, an inductor, a diode, a transistor, a thyristor, an integrated circuit or the like. A second pad 3 is also formed by structuring techniques from the conductive layer on the insulating layer 1 which second pad 3 is already covered by a layer of hard gold 4, thus forming the hard gold-plated edge connector 5.

When the first pad 2 is to be prepared, for example, for wire bonding and is therefore to be subjected to a surface treatment, such as the previously described ENEPIG treatment to form an ENEPIG layer 6 as shown in FIG. 2 on the first pad 2, the hard gold-plated edge connector 5 has to be covered by a protective layer 6 of dry film or lacquer in order to protect the hard gold-plated edge connector from being coated with an ENEPIG layer. The protective layer 6, for example made of dry film or photoresist lacquer, is, however, prone to be dissolved or to leach into the bath of the ENEPIG treatment line, so that the chemicals would quickly be contaminated with the organics of the film or the lacquer. In order to avoid this, the invention provides for the above-described semi-finished product and the inventive method for producing a printed circuit board as shown in FIG. 3.

Figure 3A:
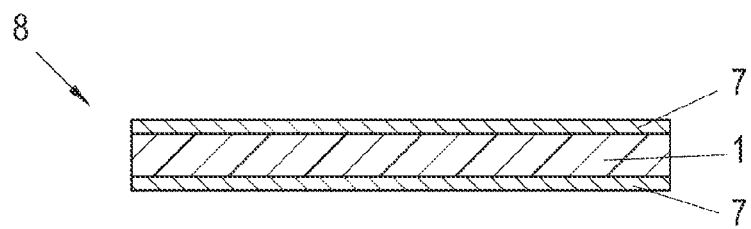
Figure 3B:
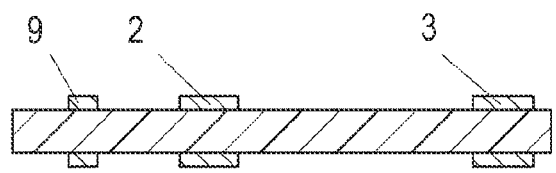
Figure 3C:
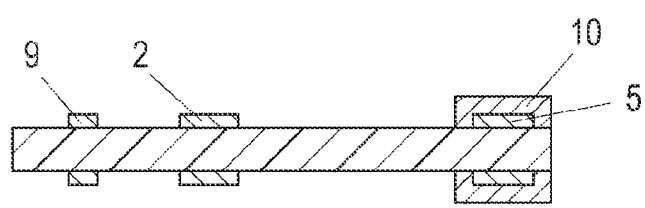
Figure 3D:
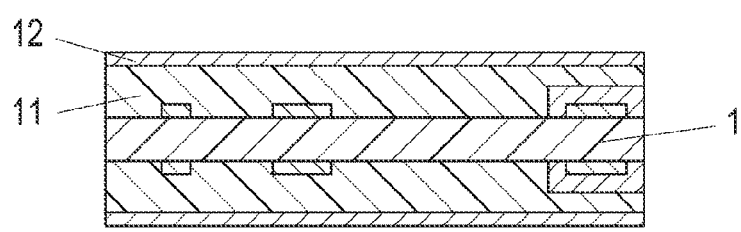

FIG. 3a shows an insulating layer 1 that has conductive layers 7 applied on both sides. The element 8 could be a prepreg covered on both sides with copper foil. Such an element 8 is known in the art as a "core" material. In FIG. 3b it can be seen that the uniform conductive layer 7 of FIG. 3a has been structured to form wirings 9 and first and second pads 2 and 3 from the copper material of the conductive layer 7. As can also be seen in FIG. 3b, the process is carried out symmetrically on both sides of the core or element 8, so that the inventive semi-finished product according to FIG. 3d will have a symmetrical structure with respect to a central insulating layer 1. For the sake of clarity, reference numerals, however, will only be attributed to the structural elements on the top side of the inventive semi-finished product and the inventive printed circuit board. The inventive process is further carried out to provide a release layer 10 on the hard gold-plated edge connector 5 (FIG. 3c), whereupon the structures of FIG. 3c formed by the remainders of the conductive layer 7, i.e. the wirings 9 and the first pad 2 as well as the hard gold-plated edge connector 5, covered by a release layer 10 are fully covered by at least one group of an insulating layer 11 and a conductive layer 12 in order to avoid the above-described dissolution or leaching into the baths containing the chemicals for the ENEPIG treatment. As can be seen in FIG. 3d the inventive semi-finished product has the hard gold-plated edge connector arranged on an inner conductive layer of the semi-finished product and the hard gold-plated edge connector is fully covered by at least one group of an insulating layer and a conductive layer.

In step 3e contacting pads 13 for wire bonding are applied on a further conductive layer by structuring a conductive layer to form connector pads and surface treating those connector pads, for example, by the ENEPIG treatment. During these steps the hard gold-plated connector pads 5 are separated from the chemicals of the ENEPIG treatment so that the quality of the baths containing the chemicals for the ENEPIG treatment remain uncontaminated from any organic film, such as dry films, photoresist lacquers of the release layers 10.

Figure 3E:
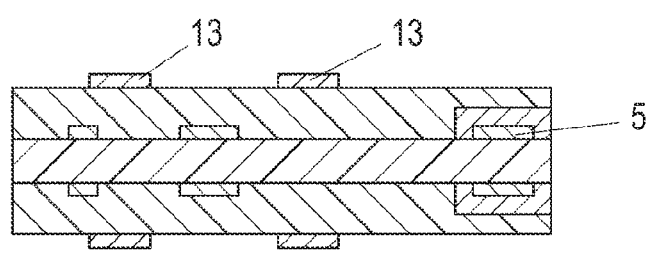
Figure 3F:
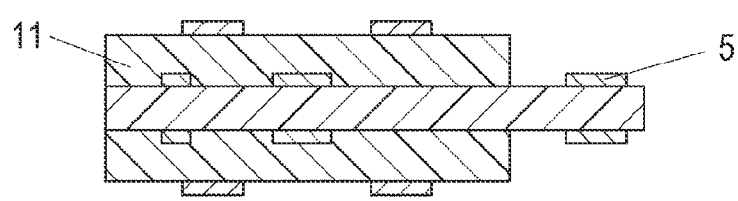

In a final step, the semi-finished product according to FIG. 3e is cut and stripped to remove the layers covering the hard gold-plated edge connector 5. The bondability of the ENEPIG layer 6 is not affected by the stripping. As can be seen in FIG. 3f, the inventive method results in a printed circuit board having a plurality of alternately arranged insulating layers and conductive layers and having a hard gold-plated edge connector, wherein the hard gold-plated edge connector is arranged on an inner conductive layer of the printed circuit board and the layer carrying the hard gold-plated edge connector is protruding from the plurality of insulating layers and conductive layers.

What is claimed is:

1. A semi-finished product for the production of a printed circuit board having a plurality of alternately arranged insulating layers and conductive layers and at least one hard gold-plated edge connector, where the hard gold-plated edge connector is arranged on an inner conductive layer of the semi-finished product and is fully covered by at least one group of an insulating layer and a conductive layer, characterised in that an outer conductive layer is surface-treated to have connector pads for wire bonding of electronic components and the connector pads are made of nickel deposited by electroless plating, palladium deposited by electroless plating and gold deposited by immersion plating and where the hard gold-plated edge connector is liquid coated with a release layer such that the release layer is arranged in contact with and between the hard gold-plated edge connector and the at least one group of the insulating layer and the conductive layer covering the hard gold-plated edge connector; and the release layer is formed by a material selected from the group consisting of metal soaps of Al, Mg, Ca, Na and Zn, combined with a binding agent and a solvent.

2. The semi-finished product according to claim 1, characterised in that the semi-finished product has a symmetrical structure with respect to a central insulating layer.

3. A printed circuit board comprised of a plurality of alternately arranged insulating layers and conductive layers and at least one hard gold-plated edge connector the hard gold-plated edge connector being arranged on an inner conductive layer of the printed circuit board, the inner conductive layer forming the hard gold-plated edge connector protruding from the plurality of insulating layers and conductive layers, characterised in that an outer conductive layer of the printed circuit board is surface-treated to have connector pads for wire bonding of electronic components and the connector pads are made of nickel deposited by electroless plating, palladium deposited by electroless plating and gold deposited by immersion plating and where the hard gold-plated edge connector is liquid coated with a release layer such that the release layer is arranged in contact with and between the hard gold-plated edge connector and the at least one group of the insulating layer and the conductive layer covering the hard gold-plated edge connector; and the release layer is formed by a material selected from the group consisting of metal soaps of Al, Mg, Ca, Na and Zn, combined with a binding agent and a solvent.

* * * * *